United States Patent
Tsao et al.

(10) Patent No.: US 6,960,518 B1
(45) Date of Patent: Nov. 1, 2005

(54) BUILDUP SUBSTRATE PAD PRE-SOLDER BUMP MANUFACTURING

(75) Inventors: Pei-Haw Tsao, Taichung (TW); Chender Huang, Hsin-Chu (TW); Jones Wang, Taipei (TW); Ken Chen, Hsinchu (TW); Hank Huang, Jungli (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/199,855

(22) Filed: Jul. 19, 2002

(51) Int. Cl.[7] .......................................... H01L 21/441
(52) U.S. Cl. .................................................. 438/616
(58) Field of Search ................. 438/597, 599, 438/611, 612, 613, 618, 760, 615, 616; 257/737, 257/738

(56) References Cited

U.S. PATENT DOCUMENTS

| | | | | |
|---|---|---|---|---|
| 5,492,266 A | * | 2/1996 | Hoebener et al. | 228/248.1 |
| 5,646,068 A | * | 7/1997 | Wilson et al. | 438/108 |
| 6,136,047 A | * | 10/2000 | Karasawa et al. | 29/25.01 |
| 6,288,376 B1 | | 9/2001 | Tsumura | 219/635 |
| 6,289,803 B1 | | 9/2001 | Ball | 101/123 |
| 6,293,456 B1 | | 9/2001 | MacKay et al. | 228/254 |
| 6,295,730 B1 | | 10/2001 | Akram | 29/843 |
| 6,300,250 B1 | | 10/2001 | Tsai | 438/694 |
| 6,409,073 B1 | * | 6/2002 | Kaskoun et al. | 228/180.22 |
| 6,432,807 B1 | * | 8/2002 | Tsukui et al. | 438/613 |
| 6,518,093 B1 | * | 2/2003 | Nakamikawa | 438/108 |

* cited by examiner

Primary Examiner—Craig A. Thompson
Assistant Examiner—Jennifer M Dolan
(74) Attorney, Agent, or Firm—Thomas, Kayden, Horstemeyer & Risley

(57) ABSTRACT

A new method is provided for the interconnection of flip chips to a supporting substrate. The invention starts with a conventional first substrate, that serves as a semiconductor device support structure, over the surface of which a first pattern of contacts points has been provided. The invention then uses a second substrate, for instance a glass or quartz plate, and creates over the surface thereof a second pattern of solder bumps separated by solder non-wettable surfaces. The second pattern is a mirror image of the first pattern. By then overlying the first pattern of contact points with the second pattern of solder bumps, a step of reflow can be applied to the solder bumps, transferring the solder bumps from the second substrate to the contact points provided over the first substrate.

6 Claims, 4 Drawing Sheets

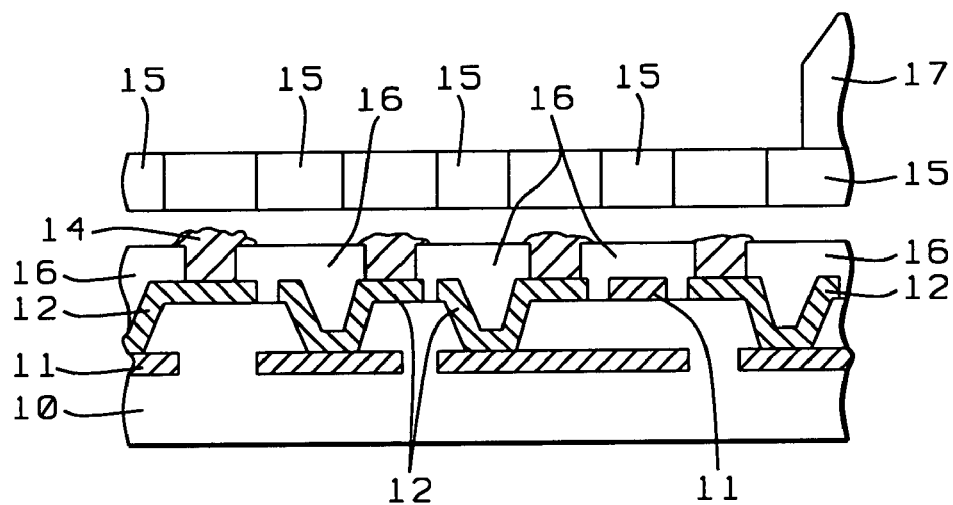
*FIG. 1 - Prior Art*
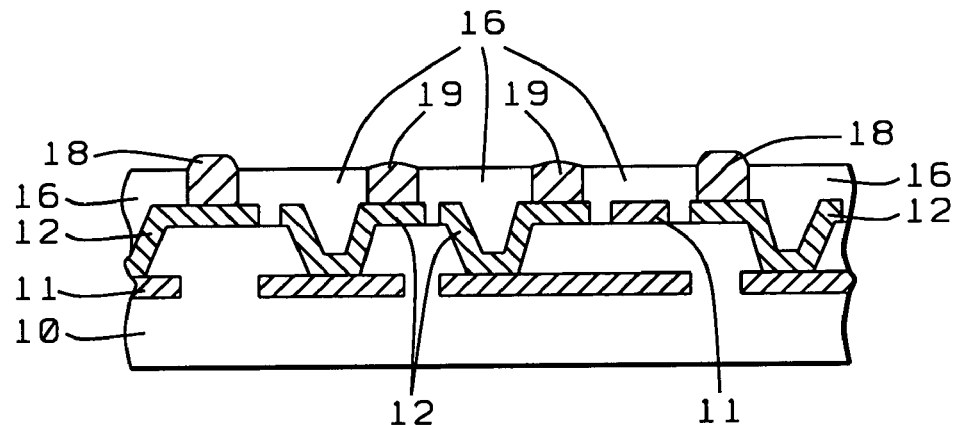
*FIG. 2 - Prior Art*
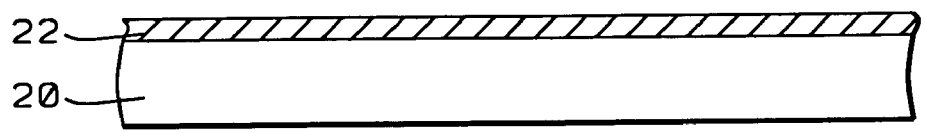
*FIG. 3*

BUILDUP SUBSTRATE PAD PRE-SOLDER BUMP MANUFACTURING

BACKGROUND OF THE INVENTION (1). Field of the Invention

The invention relates to the fabrication of integrated circuit devices, and more particularly, to a method for the creation of a pre-solder bump.

(2). Description of the Prior Art

Semiconductor device packaging has, in view of the continued increase in device miniaturization and the therefrom following continued increase in device density, gained added importance for packaged semiconductor devices. Metal interconnects, which connect one or more semiconductor devices to surrounding circuitry or system components, have therefore become of relative more importance.

One of the approaches that has been taken to solve these packaging problems is to develop low resistance metal (such as copper) for the interconnect wires while low dielectric materials are used in between signal lines. Another approach to solve problems of I/O capability has been to design chips and chip packaging methods that offer dependable methods of increased interconnecting of chips at a reasonable manufacturing cost. This has led to the development of Flip Chip Packages.

Flip-chip technology fabricates bumps (typically Pb/Sn solders) on Al pads on the chips and interconnects the bumps directly to the package media, which are usually ceramic or plastic based. The flip-chip is bonded face down to the package medium through the shortest paths. These technologies can be applied not only to single-chip packaging, but also to higher or integrated levels of packaging in which the packages are larger and to more sophisticated substrates that accommodate several chips to form larger functional units.

The flip-chip technique, using an area I/O array, has the advantage of achieving the highest density of interconnect to the device combined with a very low inductance interconnection to the package. The packaging substrate is generally used for Ball Grid Array (BGA) packages but can also be used for Land Grid Array (LGA) and Pin Grid Array (PGA) packages.

The packaging of a flip chip to a printed circuit board consists of attaching the flip chip to this board or to any other matching substrate. A flip chip is a semiconductor chip that has a pattern or array of terminals spaced around the active surface of the flip chip, the flip chip is mounted face (active surface) down onto a substrate.

Electrical connectors that are provided on the active surface of the flip chip can consist of an array of minute solder balls. The flip chip is bonded to the printed circuit board by refluxing the solder balls of the flip chip. The solder balls may also be replaced with a conductive polymer.

With the continuing decrease in the contact pads that are used to connect pre-solder bumps thereto, the uniformity of the pre-solder bumps becomes increasingly more important. The invention addresses this issue and provides a method that significantly improves the uniformity of the pre-solder bumps that interface between the semiconductor device and the device-supporting medium over which the device is mounted.

U.S. Pat. No. 6,300,250 B1 (Tsai) shows a solder bump process for a flip chip application.

U.S. Pat. No. 6,293,456 B1 (MacKay et al.), U.S. Pat. No. 6,289,803 B1 (Ball) and U.S. Pat. No. 6,288,376 B1 (Tsumura) disclose solder bump and substrate processes.

U.S. Pat. No. 6,295,730 B1 (Akram) shows a solder bump process.

SUMMARY OF THE INVENTION

A principle objective of the invention is to provide a method for the interconnection of flip chips to a supporting substrate such that small-pitch solder bumps can be used.

Another objective of the invention is to increase the planarity and pre-solder bump uniformity for the era of small-pitch solder bump applications.

Yet another objective of the invention is to provide a method for interconnecting flip chips to a supporting substrate such that substrate losses are reduced.

A still further objective of the invention is to provide a method of interconnecting flip chip devices to a supporting substrate that replaces current stencil printing methods.

In accordance with the objectives of the invention a new method is provided for the interconnection of flip chips to a supporting substrate. The invention starts with a conventional first substrate, that serves as a semiconductor device support structure, over the surface of which a first pattern of support points has been provided. The invention then uses a second substrate, for instance a glass or quartz plate, and creates over the surface thereof a second pattern of solder bumps separated by solder non-wettable surfaces. The second pattern is a mirror image of the first pattern. By then overlying the first pattern of contact points with the second pattern of solder bumps, a step of reflow can be applied to the solder bumps, transferring the solder bumps from the second substrate to the contact points provided over the first substrate.

BRIEF DESCRIPTION OF THE DRAWINGS

FIGS. 1 and 2 show prior art methods of creating pre-solder bumps.

FIGS. 3 through 10 explain the invention, as follows:

FIG. 3 shows a cross section of a (glass or quarts) first substrate over the surface of which a layer of gold has been sputter deposited.

FIG. 4 shows a cross section after a layer of copper has been deposited.

FIG. 5 shows a cross section after the deposited layer of copper has been patterned and etched, creating an array of openings there through.

FIG. 6 shows a cross section after black oxide surface treatment of the patterned and etched layer of copper.

FIG. 7 shows a cross section after solder balls have been formed over the first substrate in accordance with the array of openings created through the layer of copper.

FIG. 8 shows a cross section after the first substrate of FIG. 7 has been turned upside down and positioned over the surface of a second substrate.

FIG. 9 shows a cross section after reflow of the solder balls, creating an electrical interface between the solder balls and contact pads and interconnect traces over the surface of the second substrate.

FIG. 10 shows a cross section after the first substrate has been removed from above the second substrate.

DESCRIPTION OF THE PREFERRED EMBODIMENTS

Figure 4:
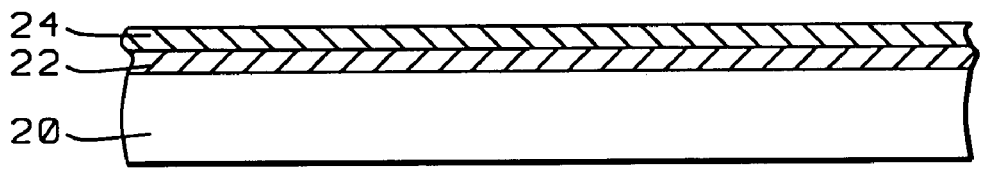

In order to facilitate a comparison between current practices of mounting flip chip devices and the method provided by the invention, a prior art method is first briefly highlighted.

Using current practice of mounting a flip chip over the surface of a substrate, whereby the substrate is typically an organic buildup, a pre-solder bump is formed over the surface of a metal pad, the metal pad typically comprising copper. The pre-solder bump serves as an interface between the (copper) contact pad (that has been provided over the surface of a flip chip support structure) and a solder bump (that has been provided over the active surface of a flip chip). The pre-solder bump is aligned with the contact pad for connection therewith by means of reflow of the solder bump and the pre-solder bump. The solder bump typically comprises a high-lead material while a finer pitch eutectic solder bump can also be used. One of the disadvantages of this approach is that the pre-solder bump increases the stand-off height of the solder bump join, which is a limitation that is imposed by concerns of join reliability.

For proper flowing of the solder of the pre-solder bump, a solder paste is applied over the surface thereof for which purpose is used the method of stencil printing as shown in the prior art cross section of FIG. 1. Specifically highlighted in the cross section of FIG. 1 are the substrate 10 in and over the surface of which are created patterned and etched layers of interconnect traces such as traces 11 and interconnect pads 12. The use of a semiconductor device supporting substrate 10 and the therewith associated interconnect traces is well known in the art and is not of direct interest to the invention.

The substrate that has been highlighted in FIG. 1 as substrate 10 can be a semiconductor substrate, a printed circuit board, a flex circuit, a metallized substrate, a glass substrate and in general a semiconductor device mounting support. The semiconductor substrate can be selected from the group of substrates consisting of semiconductor substrates, ceramic substrates, glass substrates, gallium arsenide substrates, silicon substrates comprising a single layer of material, such as a silicon wafer or comprising silicon on insulator (SOI) technology and silicon on sapphire (SOS) technology, doped or undoped semiconductors, epitaxial layers of silicon supported by a base semiconductor, sapphire substrates or substrates used for flat panel displays.

Further highlighted in the cross section of FIG. 1 are the solder paste 14 that is applied over the contact pads 12 and the exposed interconnect traces 11. The solder paste 14 is bounded by the solder mask 16, the stencil 15 is for this purpose positioned above and aligned with the contact pads and the exposed interconnect over which solder paste is to be applied. The squeegee 17 serves the purpose of forcing the solder paste into and through the stencil openings 15 and onto the exposed interconnect metal such as contact pads and interconnect traces. In short: with the stencil the solder paste is printed over the surface of exposed interconnect pads and traces that have been provided over the surface of substrate 10.

After the step that has been shown in cross section in FIG. 1 has been completed, the pre-solder bumps are formed by solder reflow and coining, the latter applied in order to improve bump co-planarity. The cross section that is shown in FIG. 2 is obtained in this manner. From this cross section of FIG. 2 it is however clear that the uniformity of the created pre-solder bumps is not as desired. By for instance comparing the pre-solder bumps 18 with pre-solder bumps 19, it is clear that the elevation of pre-solder bumps 18 is considerably higher than the elevation of pre-solder bumps 19. This is already evident from the cross section of FIG. 1 by comparing the deposited amount of solder paste over and around the corresponding contact pads: the outermost two contact pads (not highlighted) in FIG. 1 have accumulated a significant amount of solder paste in excess of the solder paste that has been accumulated over and around the innermost contact pads, resulting in the highlighted difference in height of the final pre-solder bumps of FIG. 2.

This highlighted phenomenon of non-uniformity of pre-solder bumps becomes more of an issue for decreased pitch of the exposed metal over the surface of substrate 10. For practical applications, the stencil printing technique is no longer a viable technique for closely spaced contact pads and interconnect traces. The invention addresses this concern and provides a method that can replace the conventional method of stencil printing.

The invention will now be explained in detail using FIGS. 3 through 10 for this purpose.

Referring now specifically to the cross section shown in FIG. 3, this cross section comprises a first substrate 20, preferably of glass or quartz or titanium, over the surface of which a thin layer 22 of gold is sputtered. The thickness of the layer 22 is not critical to the invention but must be enough so that a suitably plated solder bump can be formed therewith, the thickness of layer 22 is therefore preferred to be between about 0.1 and 0.5 $\mu$m. Layer 22, the first layer of metal, serves as a solder plating seed layer.

The substrate 20 is used for the formation of arrays of plated solder bumps over the surface thereof, the sputtered layer 22 of gold is used to form a solder plating seed layer.

Over the surface of layer 22, FIG. 4, a layer 24 of copper is sputter deposited or plated, preferably to a thickness between about 1 and 2 $\mu$m.

Figure 5:
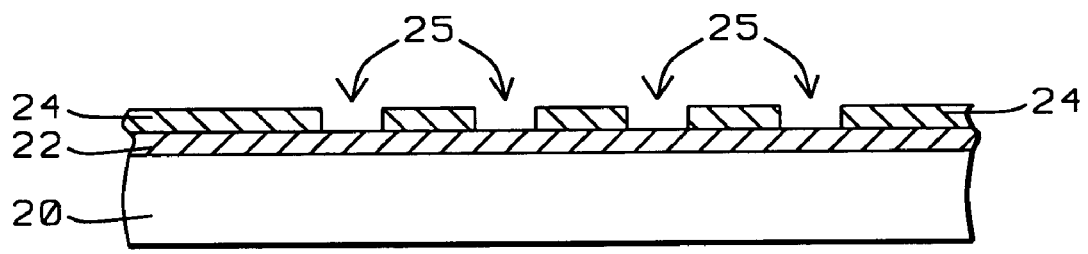

By applying conventional methods of photoresist masking and etch, an array of openings 25, FIG. 5, is created through the layer 24. The pattern of this array of openings 25 is identical to a pattern of exposed contact pads and traces created over the surface of a supporting substrate over the surface of which a semiconductor device is to be mounted. This pattern therefore is also identical to the pattern of solder bumps that are created over the active surface of the semiconductor device that is to be mounted over the device-supporting medium.

Figure 6:
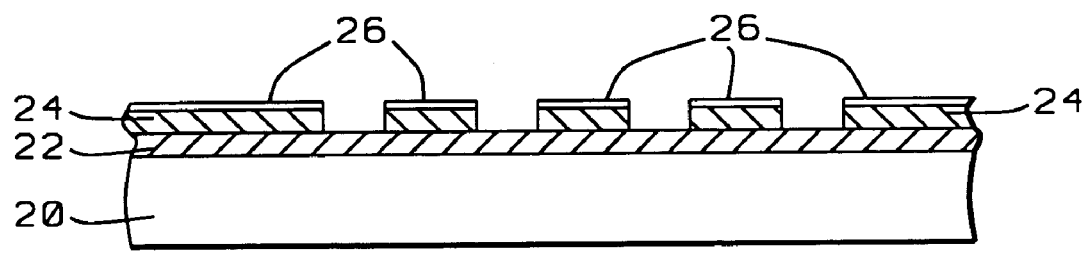

The exposed surface of the patterned and etched layer 24 is now exposed, FIG. 6, by applying a black-oxide copper surface treatment to these exposed surfaces. This makes the surface of the patterned layer 24 of copper such that solder is resistant to adhering to the surface of the patterned and etched layer 24 of copper. Otherwise stated: the surface of the patterned and etched layer 24 of copper now forms a non-solder wettable surface, that is solder will not adhere to this surface. The back oxide surface treatment is a conventional chemical etching process as is typically performed on the package substrate side.

The surface of the patterned layer 24, that is the created black oxide copper surface, has been highlighted as surface regions 26 in the cross section of FIG. 6.

It is, as is evident from the above explanation, now relatively easy to create solder bumps inside and surrounding the pattern of openings 25 that have been created through layer 24. Plating solder over the exposed surface of FIG. 6 will result in the plated solder accumulating inside openings 25 while, as far as internal adhesion within the plated solder allows, spilling over the black oxide surface 26 of the patterned and etched layer 24. This is shown in cross section in FIG. 7, where the created solder bumps have been highlighted as elements 28, which can be created using methods of solder plating.

Figure 7:
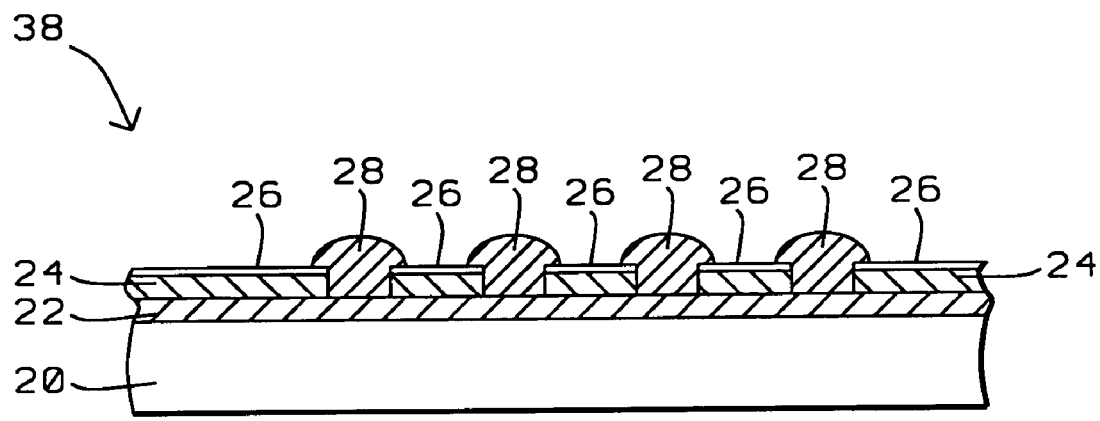
Figure 8:
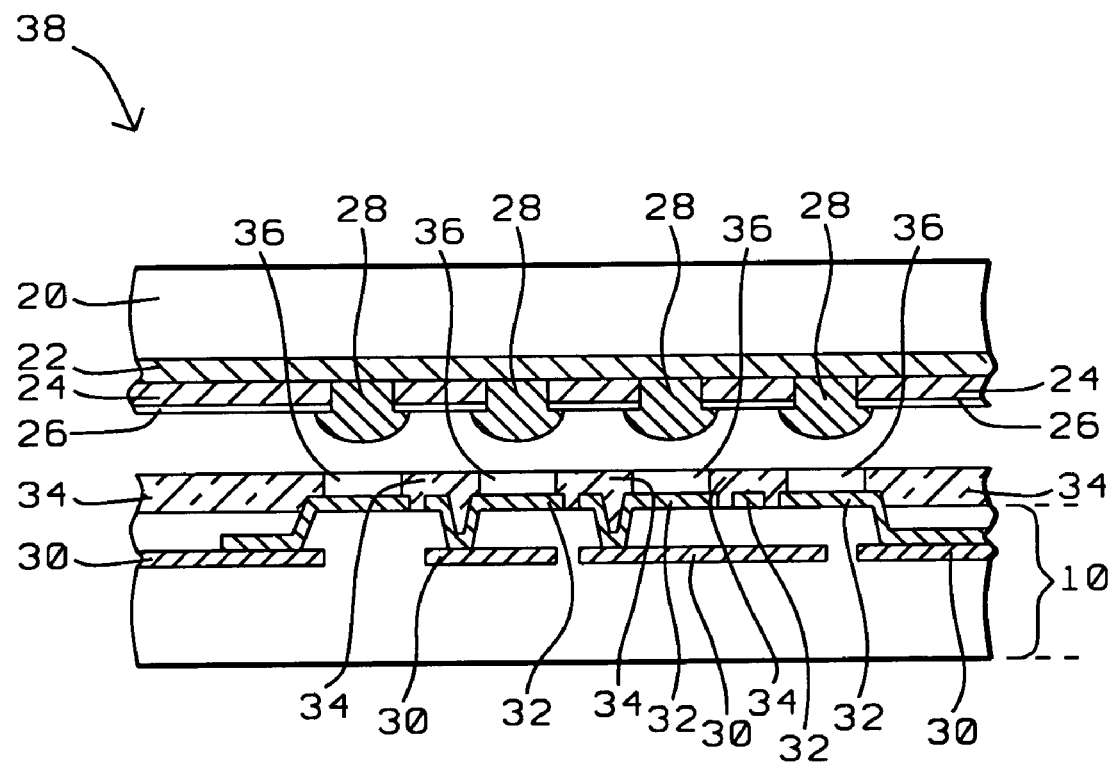

After having created the structure 38 shown in cross section in FIG. 7, the invention now, FIG. 8, provides a second substrate 10. The structure 38 shown in cross section in FIG. 7 is rotated 180 degrees or, which is the same, turned upside-down so that the solder bumps 28 face in a downward direction and are opposite to the upper surface of the substrate 10, FIG. 8.

Provided in substrate 10 are the conventional elements that are typically part of a supporting substrate over the surface of which a semiconductor device is to be mounted. Specifically highlighted in the cross section of FIG. 8 are:

10, the device supporting substrate 30, a first layer of interconnect traces created in substrate 10

32, a second layer of interconnect traces created in substrate 10

34, the solder mask created over the surface of substrate 10; the solder mask is provided, as is conventional, so that openings through the mask expose metal interconnect to which connections are to be made 36, solder flux that has been applied over the surface of the solder mask 38 to enhance solder reflow.

Notable in the cross section that is shown in FIG. 8 is that the solder bumps 28 align with the folder flux 36 and therewith with the openings that are provided through the solder mask 34. Since the openings through the solder mask expose the surfaces of interconnect traces 32 with which electrical interconnect must be established, the solder balls 28 are also aligned with the surfaces of the exposed layers of interconnect traces in the surface of substrate 10 with which interconnects must be established.

It is clear that the interconnect traces that have been shown and discussed for substrate 10 serve merely as examples and that a substrate can comprise multiple layers of interconnect traces. However, even when creating multiple layers of interconnect traces in or over a device supporting substrate, these traces must ultimately be made accessible by exposing contact pads or traces over the surface of substrate 10. Layers 32 are shown in the cross section of FIG. 8 as being representative of these latter, exposed interconnect surfaces.

By now lowering the unit 38, FIG. 7 and FIG. 8, onto the surface of substrate 10, the solder balls 28 come in contact with the exposed surfaces of the interconnect traces 32 provided over the surface of substrate 10.

Figure 9:
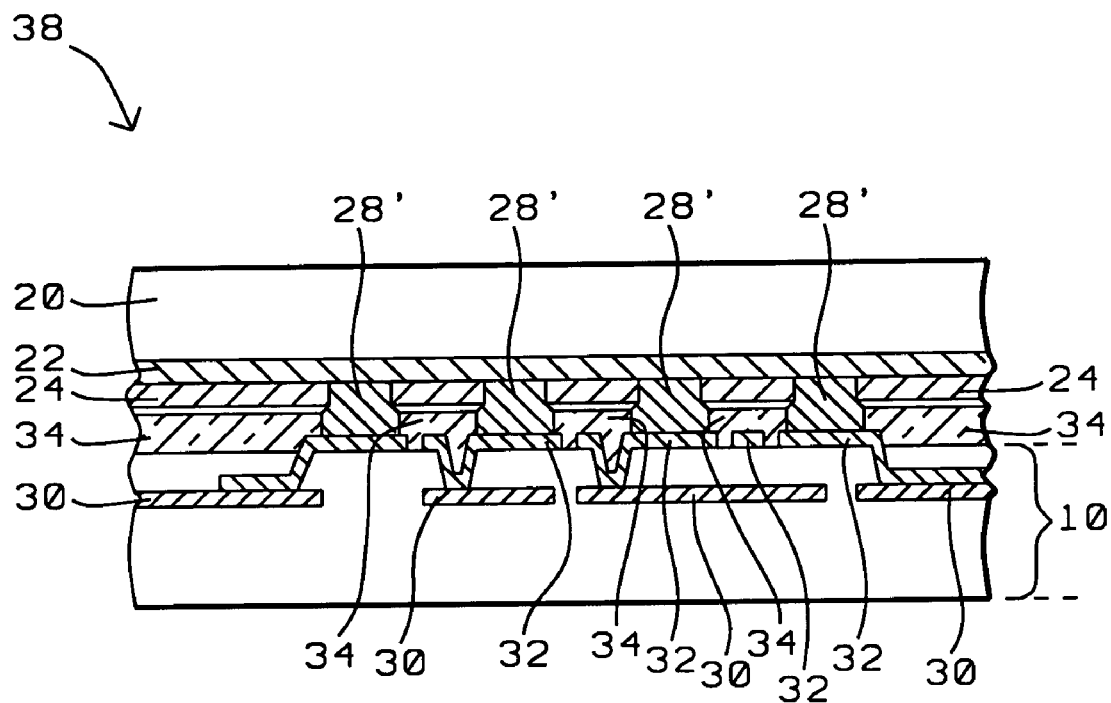

By heating the combined structure that is shown in cross section in FIG. 8, whereby it is assumed that the structure 38 has been brought into contact with the surface of substrate 10, a heating that is applied for the purpose of reflow of the solder balls 28, the solder balls that have been highlighted as solder balls 28' in FIG. 9 will be obtained.

Figure 10:
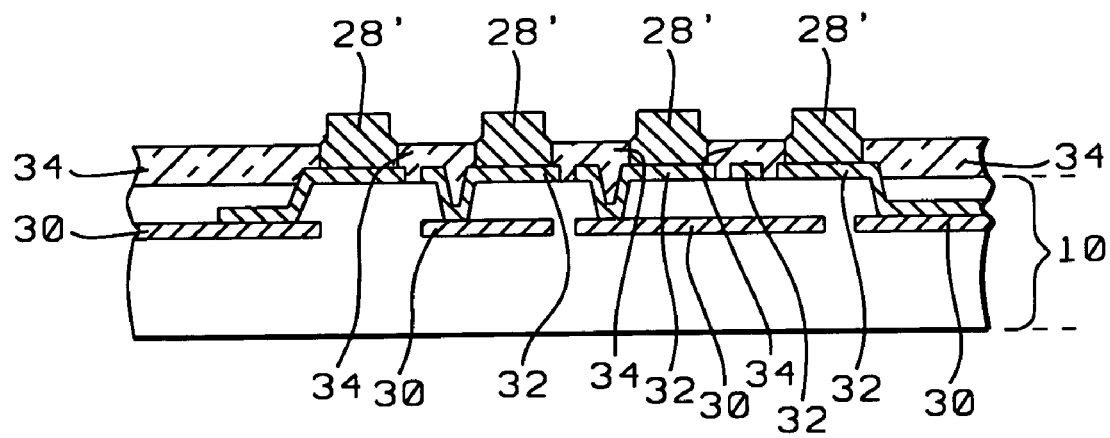

By now removing the structure 38, FIG. 9, from above the surface of substrate 10, the structure shown in cross section in FIG. 10 is obtained. It is clear from the cross section shown in FIG. 10 that the planarity of the surfaces of contact balls 28' is now determined by the planarity of the original substrate 20, FIG. 3. The thereover sputtered layer 22 of gold is dissolved in solder as the non-wettable surface of substrate 20 is exposed. This results in the solder being separated from the substrate 20 while being attached to substrate 10. Due to the plating technique that is used, bump uniformity can in this manner be obtained independent of the pitch of the copper pads to which electrical contact must be established.

To summarize the invention:

The invention uses two substrates

A first substrate of the invention is a conventional substrate over the surface of which one or more semiconductor devices are to be mounted; this conventional substrate has therefore been provided with a first pattern of points of electrical contact, typically comprising contact pads over the surface thereof A second substrate used by the invention is provided with a second pattern of solder bumps, the second pattern of solder bumps is the inverse of the first pattern of contact points such that, by rotating the second pattern of solder bumps in an upward-down position, the second pattern of solder bumps overlies the first pattern of points of contact, and By bringing the second pattern of solder bumps in contact with the first pattern of contact points, the solder bumps of the second pattern can be heated for reflow, creating a pattern of uniform solder bumps over the surface of the first substrate in accordance with the first pattern of points of electrical contact provided over the surface of the first substrate.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating solder bumps over a substrate, comprising the steps of:

providing a first substrate, said first substrate being a substrate over which at least one semiconductor device is to be mounted, said first substrate having been provided with one or more layers of interconnect traces in or over the surface thereof, said one or more layers of interconnect traces comprising a first pattern of contact points;

providing a second substrate, said second substrate having been provided with a second pattern of solder bumps over the surface thereof, said second pattern of solder bumps being a mirror image pattern of said first pattern of contact points, said second pattern of solder bumps being interspersed with a pattern of copper, said pattern of copper comprising solder non-wettable surface having been created by method of black oxide copper surface treatment;

matching and establishing physical contact between said first pattern of contact points and said second pattern of solder bumps by positioning above and aligning said second substrate with said first substrate;

reflowing said solder bumps, thereby transferring said second pattern of solder bumps to said first pattern of contact points;

removing said second substrate from above said first substrate, thereby creating solder bumps of uniform profile over said first substrate;

said second substrate having been provided with a second pattern of solder bumps over the surface thereof, further comprising the steps of:

providing said second substrate;

depositing a first layer of metal over said second substrate;

depositing a second layer of metal over said first layer of metal;

patterning and etching said layer of metal, thereby creating a second pattern of openings through said second second layer of metal, said second pattern being a mirror image of said first pattern;

treating said patterned second layer of metal, thereby converting said patterned second layer of metal to a solder non-wettable surface; and filling said opening created through said second layer of metal with solder.

2. The method of claim 1, said first substrate being a semiconductor device mounting support.

3. The method of claim 1, said second substrate being selected from the group of substrates comprising glass substrates and quartz substrates and titanium base substrates.

4. The method of claim 1, said first layer of metal comprising gold.

5. The method of claim 1, said second layer of metal comprising copper.

6. The method of claim 1, said patterned second layer of metal comprising methods of black oxide copper surface treatment.

* * * * *